(12) United States Patent
Miller et al.

(10) Patent No.: US 11,720,259 B2
(45) Date of Patent: *Aug. 8, 2023

(54) SELECTIVE DUMMY WRITES FOR ASYNCHRONOUS POWER LOSS HANDLING IN MEMORY DEVICES

(71) Applicant: Micron Technology, Inc., Boise, ID (US)

(72) Inventors: Michael G. Miller, Boise, ID (US); Gary F. Besinga, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,548

(22) Filed: May 18, 2022

(65) Prior Publication Data
US 2022/0276791 A1 Sep. 1, 2022

Related U.S. Application Data

(63) Continuation of application No. 17/007,539, filed on Aug. 31, 2020, now Pat. No. 11,366,592.

(51) Int. Cl.
*G06F 3/06* (2006.01)

(52) U.S. Cl.
CPC .......... *G06F 3/0619* (2013.01); *G06F 3/0659* (2013.01); *G06F 3/0679* (2013.01)

(58) Field of Classification Search
CPC .... G06F 3/0619; G06F 3/0659; G06F 3/0679; G06F 1/30; G11C 16/10; G11C 7/24; G11C 16/0483; G11C 16/30; G11C 16/22
USPC .................................................. 711/103, 102
See application file for complete search history.

(56) References Cited

U.S. PATENT DOCUMENTS

| | | | | |
|---|---|---|---|---|
| 9,159,423 B1 * | 10/2015 | Brahmadathan | ....... | G11C 16/08 |
| 2008/0225599 A1 | 9/2008 | Chae | | |
| 2016/0118143 A1* | 4/2016 | Muchherla | ........... | G11C 16/349 |
| | | | | 714/721 |
| 2018/0196705 A1* | 7/2018 | Miller | ................... | G06F 3/0659 |
| 2022/0066650 A1 | 3/2022 | Miller et al. | | |

* cited by examiner

*Primary Examiner* — David Yi
*Assistant Examiner* — Zubair Ahmed
(74) *Attorney, Agent, or Firm* — Schwegman Lundberg & Woessner, P.A.

(57) ABSTRACT

An asynchronous power loss (APL) event is detected at a memory device. A last written page is identified in the memory device in response to detecting the APL event. A count of zeros programmed in the last written page is determined. The count of zeros is compared to a threshold constraint to determine whether to perform a dummy write operation on the last written page.

20 Claims, 6 Drawing Sheets

SELECTIVE DUMMY WRITES FOR ASYNCHRONOUS POWER LOSS HANDLING IN MEMORY DEVICES

PRIORITY APPLICATION

This application is a continuation of U.S. application Ser. No. 17/007,539, filed Aug. 31, 2020, which is incorporated herein by reference in its entirety.

TECHNICAL FIELD

Embodiments of the disclosure relate generally to memory sub-systems and, more specifically, to asynchronous power loss (APL) handling in a memory sub-system.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
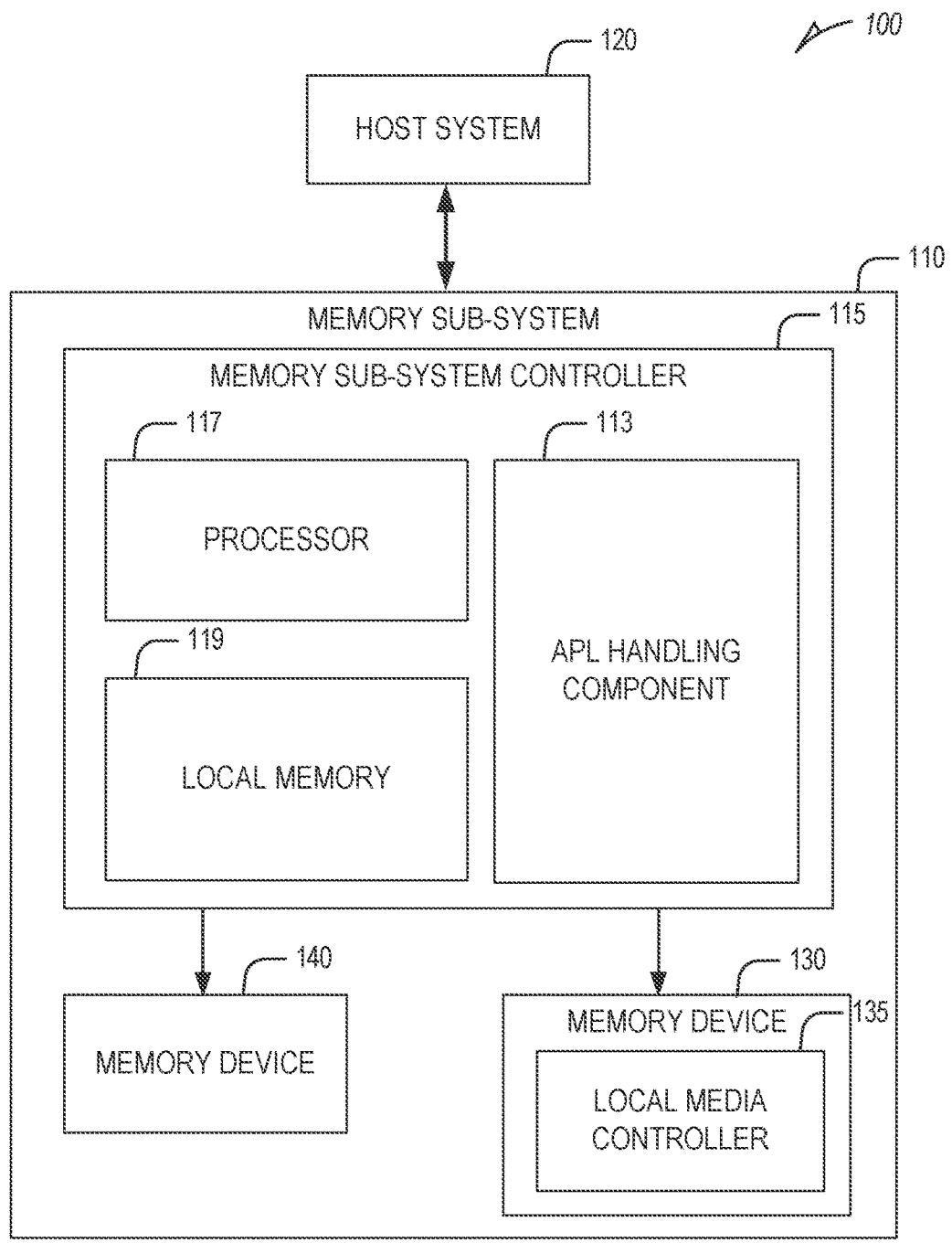
FIG. 1 is a block diagram illustrating an example computing system that includes a memory sub-system, in accordance with some embodiments of the present disclosure.

Aspects of the present disclosure are directed to selectively performing dummy write operations on an APL affected memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Some memory devices (e.g., NAND memory devices) include an array of memory cells (e.g., flash cells) to store data. Each cell includes a transistor and within each cell, data is stored as the threshold voltage of the transistor, based on the logical value the cell represents (e.g., 0 or 1). During a read operation, a read reference voltage is applied to the transistor to determine the logical value it represents, if any. Memory cells in these devices can be grouped as pages that can refer to a logical unit of the memory device used to store data. With some types of memory devices (e.g., NAND), pages are grouped to form blocks (also referred to herein as "memory blocks").

As used herein, asynchronous power loss (APL), refers to an unexpected loss of power in a memory sub-system. For example, APL may occur when the power source for the memory sub-system dips below a certain voltage threshold and ongoing operations in a memory device in the memory sub-system (e.g., erase, program or read) are interrupted. When an APL event occurs during memory device write operations, different cell types may appear programmed or erased when a read operation is performed, depending on how far along the programming was before it was interrupted by the APL event. Write operations in a memory sub-system are performed in a logical sequence defined by an internally maintained write translation table so it is inconsistent with internal system logic for erased pages to be present in a block that is supposedly fully written. Page scan operations also rely on the sequential nature of write operations, so if any page is unexpectedly read as erased, the memory sub-system attempts to recover data stored at the memory location using traditional error handling techniques and eventually using redundant array of independent NAND (RAIN) techniques. This scenario not only breaks the scan logic in the memory sub-system but also results in a very high latency within the memory sub-system.

When an APL event occurs during memory device write operations, partially written or erased pages may appear programmed or erased when a read operation is performed, depending on how far along the programming was before it was interrupted by the APL event. Conventional techniques for APL handling involve moving committed data in an APL affected block to a new block and erasing the APL affected block. With the increase in number of pages in a block, moving committed data and erasing the APL block impact Time-To-Ready (TTR) design constraints.

One approach to handling APL events that interrupt memory device write operations is to write dummy data (e.g., nonce data) to the APL affected pages to ensure that the APL affect pages are sufficiently programmed so that subsequent read operations performed on the pages return uncorrectable error correcting code (UECC) rather than an erased status. However, writing dummy data on top of a previously written or partially written page can cause program disturb errors and state level widening on previously written pages in the same wordline. Aspects of the present disclosure address APL events in memory sub-systems by selectively writing dummy data to APL affected pages of a memory device. At system initialization, an APL handling component of the memory sub-system determines the previous power loss is an APL event that interrupted a write operation at the memory device. Based on detecting the APL event, the APL handling component identifies a last written page in the memory device and determines a count of zeros programmed in the last written page. The APL handling component compares the count of zeros to a threshold constraint. If the count of zeros satisfies the constraint, the APL handling component determines that the last written page is sufficiently programmed and completes APL recovery processes without performing a dummy write on the last written page. If the count does not satisfy the threshold constraint, the APL handling component performs the dummy write operation on the last written page.

By writing dummy data to APL affected pages, the APL handling component ensures that APL affected pages can be reliably read back as UECC. Further, by selectively writing dummy data based on whether a page is sufficiently programmed, the APL handling component reduces the number of dummy write operations performed, thereby reducing, if not eliminating, program disturb errors and state level widening problems that can be caused by back-to-back APL scenarios.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes an asynchronous power loss (APL) handling component 113 that is responsible handling APL events within the memory sub-system 110. APL handling includes two phases: 1) APL detection and 2) APL recovery. During APL detection, the APL handling component 113 determines whether a previous system power down is normal or unexpected. APL detection is performed as part of initialization of the memory device 130. The APL handling component 113 uses specialized read operations and system flag checks to determine if an APL event occurred. During the APL recovery phase, the APL handling component 113 ensures data committed to the memory device 130 are intact and corrupted data is recovered. As part of the APL recovery phase, the APL handling component 113 can write dummy data to pages of the memory device 130 that are affected by the APL event (hereinafter also referred to as "APL affected pages"). The APL handling component selectively performs dummy write operations based on whether the APL handling component determines a page is sufficiently programmed based on a number of zeros programmed in the page. Further details regarding dummy write operations by the APL handling component 113 are discussed below.

In some embodiments, the memory sub-system controller 115 includes at least a portion of the APL handling component 113. For example, the memory sub-system controller 115 can include a processor 117 (processing device) configured to execute instructions stored in local memory 119 for performing the operations described herein. In some embodiments, the APL handling component 113 is part of the host system 120, an application, or an operating system. In some embodiments, the local media controller 135 includes at least a portion of the APL handling component 113.

Figure 2:
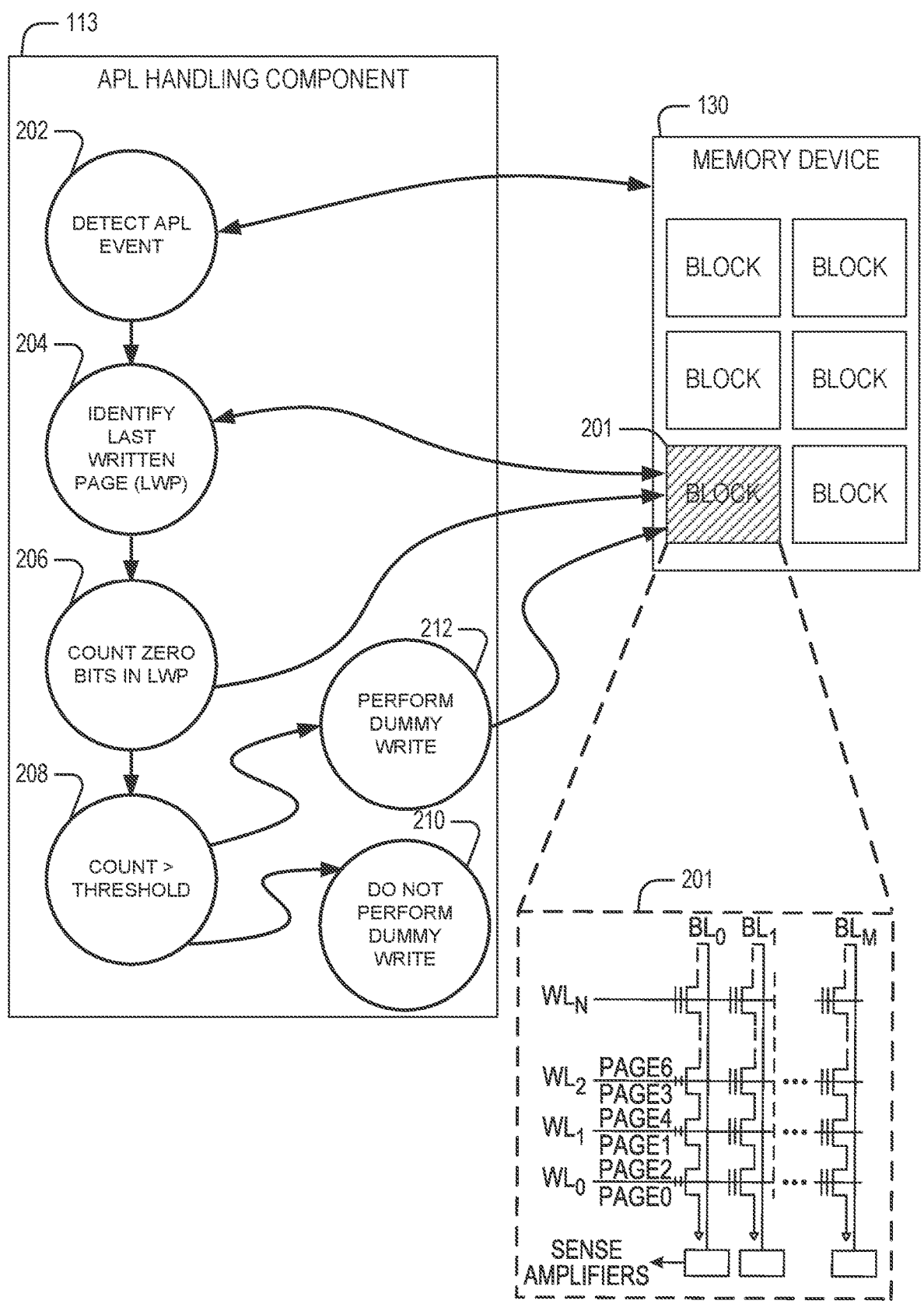
FIG. 2 is a diagram illustrating interactions between components of the memory sub-system in handling an APL event, in accordance with some embodiments of the present disclosure.

FIG. 2 is a data flow diagram illustrating interactions between components of the memory sub-system in handling an APL event, in accordance with some embodiments of the present disclosure. In the example illustrated in FIG. 2, the memory device 130 is a NAND memory device including multiple blocks. For example, as shown, a NAND block 201 includes an array of NAND cells that includes pages (rows) and strings (columns). Each cell includes a transistor and within each cell, data is stored as the threshold voltage of the transistor, based on the logical value of the cell (e.g., 0 or 1). During a read operation, a read reference voltage is applied to the transistor, and if the read reference voltage is higher than the threshold voltage of the cell, the transistor is programmed and is recognized by a memory sub-system as a binary value of 0. If the read reference voltage is lower than the threshold voltage of the cell, the transistor is recognized as a binary value of 1.

Strings are connected within the NAND block to allow storage and retrieval of data from selected cells. NAND cells in the same column are connected in series to form a bit line (BL). All cells in a bit line are connected to a common ground on one end and a common sense amplifier on the other for reading the threshold voltage of one of the cells when decoding data. NAND cells are connected horizontally at their control gates to a word line (WL) to form a page. A page is a set of connected cells that share the same word line and is the minimum unit to program.

Upon initialization of the memory sub-system 110 at 200, the APL handling component 113 determines whether a previous system power down was a normal system power down or an APL event. To determine if the previous power down is an APL event, the APL handling component 113 performs specialized read operations and system flag checks. For example, the APL handling component 113 can obtain data from the memory device 130 (e.g., using one or more commands) that indicates whether a power loss occurred, whether a page is fully erased, partially erased, fully programmed or partially programmed, and whether programming of a page was interrupted prematurely.

Based on detecting the APL event, the APL handling component 113 queries the memory device 130 to identify the last written page (LWP), at 204. Within the memory device 130, write operations are performed sequentially according to an internal table referred to as a write translation table. The LWP is identified based on the write translation table.

The APL handling component 113 analyzes the LWP to determine whether the LWP is sufficiently programmed to avoid performing a dummy write operation on the LWP. To this end, the APL handling component 113 counts the zeros programmed into the LWP, at 206, and compares the count to a threshold constraint, at 208. The APL handling component 113 can determine the count of zeros by applying a read reference voltage to cells in the page. If the read reference voltage is higher than the threshold voltage of the cell, the cell is recognized by the APL handling component 113 as being programmed with a zero. As will be discussed in further detail below, each page type has one or more associated read levels, and the read level associated with the page type determine the read reference voltage applied to the page during normal read operations. In counting zeros programmed in the LWP, the APL handling component 113 shifts the read levels such that the read reference voltage applied at every level is decreased relative to default read levels.

If the count satisfies the threshold condition (e.g., the count of zeros is greater than a threshold value), the APL handling component 113 does not perform at dummy write operation as the LWP is sufficiently programmed (210). If the count does not satisfy the threshold condition (e.g., the count of zeros is less than the threshold value), the APL handling component 113 writes dummy data to the LWP.

Figure 3:
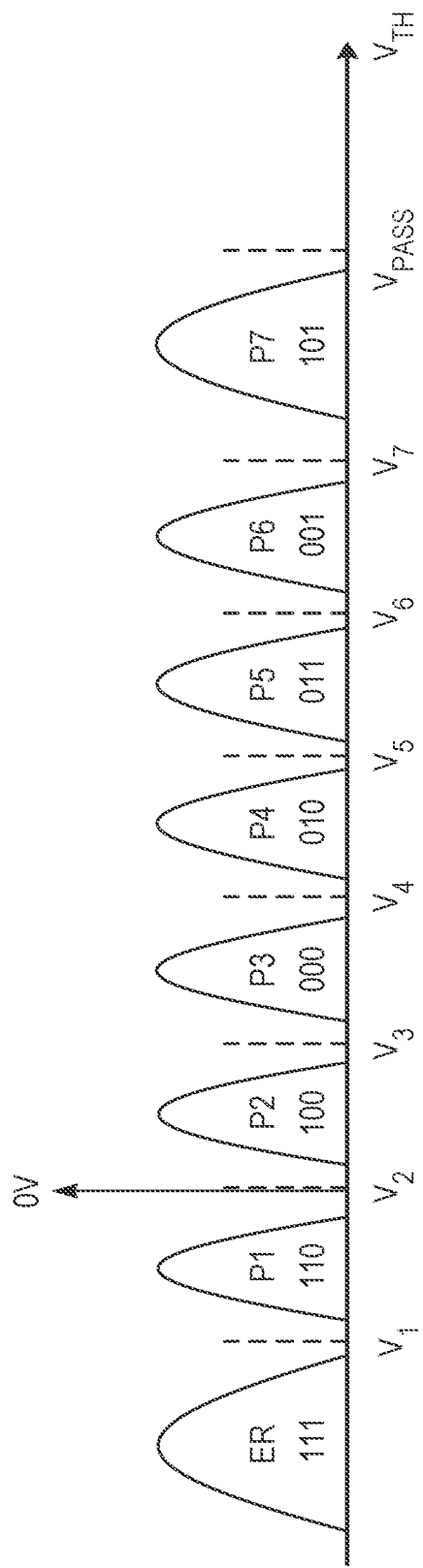
FIG. 3 is a graph illustrating an example voltage threshold distribution in a memory device cell, in accordance with some embodiments of the present disclosure.

With reference to FIG. 3, an example threshold voltage distribution in a 3-bit TLC NAND flash cell. As noted above, each NAND cell stores data in the form of a threshold voltage ($V_{th}$), the lowest voltage at which the cell can be turned on. With reference to FIG. 3, the threshold voltage range of a 3-bit TLC is divided into eight regions by seven reference voltages $V_1$, $V_2$, $V_3$, $V_4$, $V_5$, $V_6$, and $V_7$. The reference voltages $V_1$, $V_2$, $V_3$, $V_4$, $V_5$, $V_6$, and $V_7$ are also referred to "read levels". The region in which the threshold voltage of the cell represents the current state of the cell. As shown, the state of a TLC NAND flash cell is one of the following: ER (erased), P1, P2, P3, P4, P5, P6 or P7. Each cell state decodes into a 3-bit value that is stored in the flash cell (e.g., 111, 110, 100, 000, 010, 011, 001, and 101). The threshold voltage of all cells in the memory device 130 is bounded by an upper limit: Vpass, which is the pass-through voltage.

As discussed above, NAND cells in the memory device 130 are organized into arrays, referred to as blocks (e.g., NAND block 201), and within each block, cells in the same row share a wordline (WL). The least significant bits (LSB) stored in a wordline form a lower page (LP), the most significant bits (MSB) stored in a wordline form an upper page (UP), and the middle bits stored in a wordline form an extra page (XP).

During a read operation, a read reference voltage (Vref) selected from read levels $V_1$, $V_2$, $V_3$, $V_4$, $V_5$, $V_6$, and $V_7$ is applied one or more times to the wordline that contains the data to be read. The read level used depends on which page type (e.g., LP, UP, or XP) is being read and unless modified, are based on default read levels associated with each page type. As an example, to read an LP page, read reference voltages $V_1$ and V5 are applied. If a cell turns off when $V_1$ is applied and turns on when V5 is applied, the cell contains a threshold voltage $V_{th}$, where $V_1 < Vth < V_5$, indicating that it is in either the P1, P2, P3, or P4 state and holds an LSB value of 0. Otherwise, if the cell is on when V1 is applied or off when V5 is applied, the cell is in the ER, P5, P6, or P7 state, holding an LSB value of 1.

Figure 4:
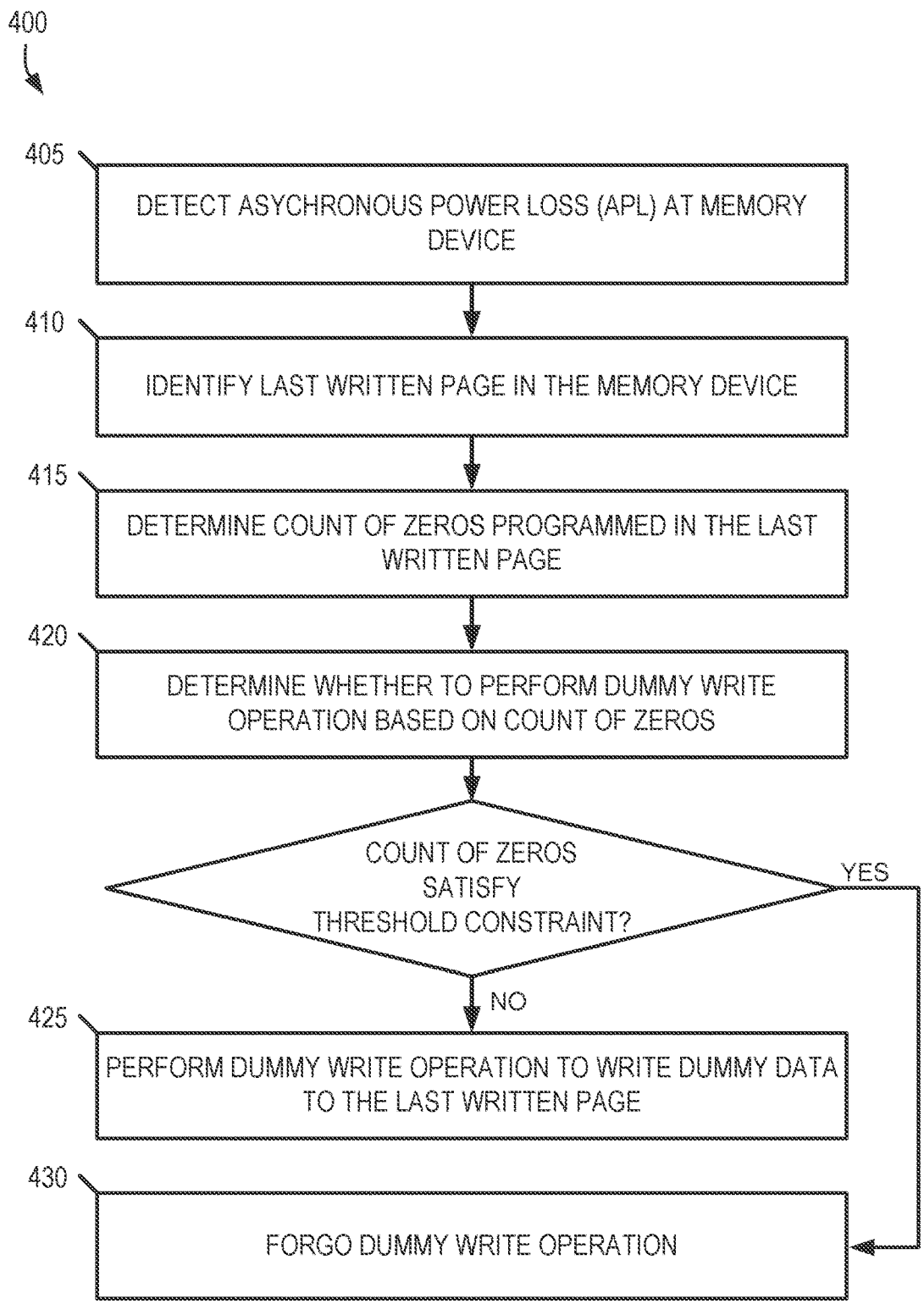
FIGS. 4 and 5 are flow diagrams illustrating an example method for APL handling in a memory sub-system, in accordance with some embodiments of the present disclosure.
Figure 5:
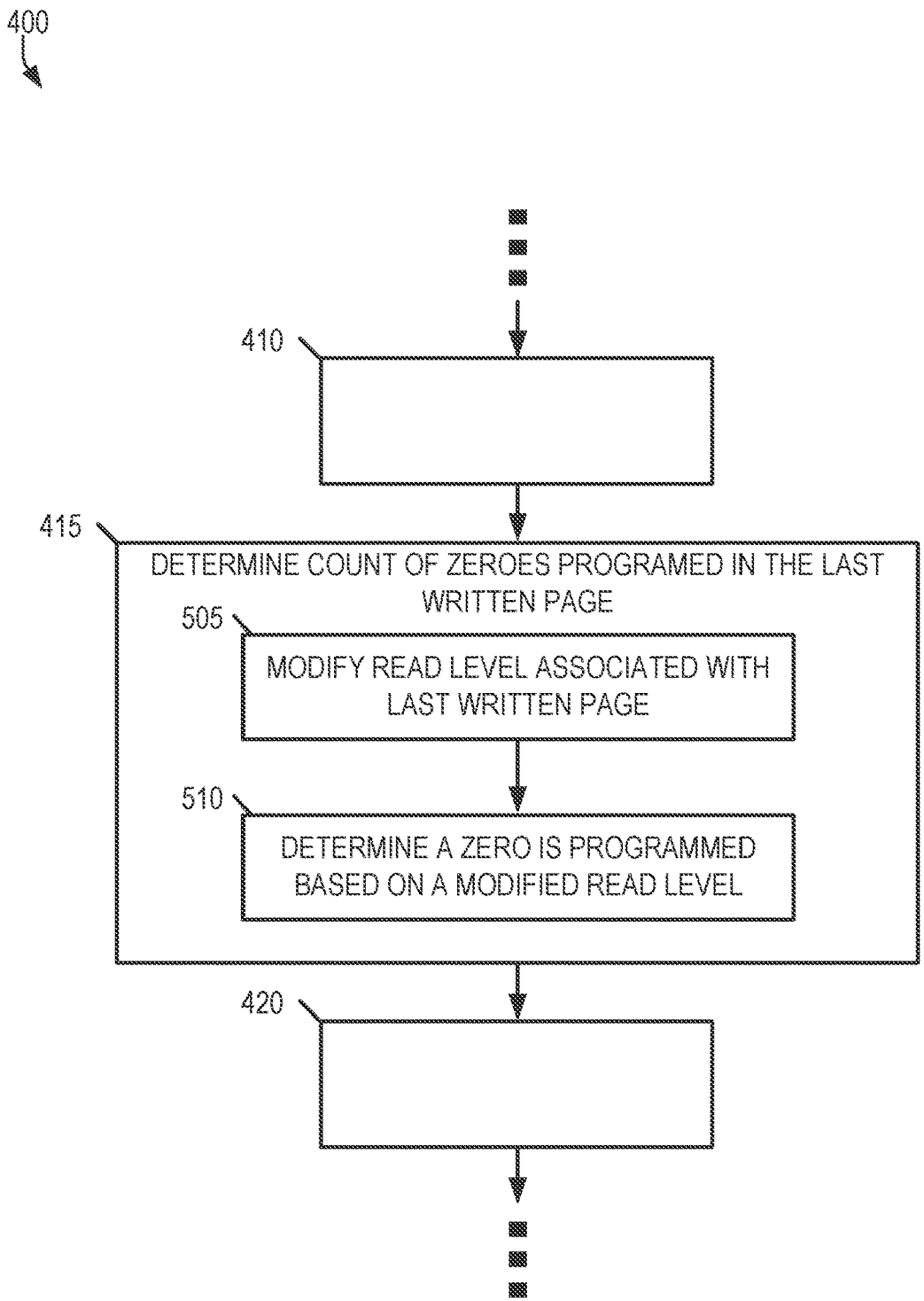

FIGS. 4 and 5 are flow diagrams illustrating an example method 400 for APL handling in a memory sub-system (e.g., the memory sub-system 110) in accordance with some embodiments of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the APL handling component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device detects an APL event that occurred at a memory device (e.g., the memory device 130) while a write operation was being performed. That is, the processing device determines that a previous power loss that interrupted a write operation was an APL event. In detecting the APL event, the processing device performs specialized read operations and system flag checks. For example, the processing device can obtain data from the memory device that indicates whether a power loss occurred, whether a page is fully erased, partially erased, fully programmed or partially programmed, and whether programming of a page was interrupted prematurely.

In response to detecting the APL event at the memory device, the processing device identifies a LWP in the memory device, at operation 410. The processing device can determine the LWP based on an internal table used to track write operations. Depending on the embodiment, the processing device can maintain the internal table or the processing device can obtain this information from the memory device using one or more commands.

At operation 415, the processing device determines a count of zeros programmed in the LWP. Depending on the embodiment, the processing device can determine the count of zeros by reading data from the memory device or by reading threshold voltages of each cell in the LWP and comparing the threshold voltages to a read level.

At operation 420, the processing device determines whether to perform a dummy write operation on the LWP based on the count of zeros. In determining whether to perform the dummy write operation, the processing device compares the count of zeros programmed in the LWP to a threshold constraint. If the number of zeros satisfy the threshold constraint (e.g., if the number of zeros is greater than the threshold constraint), the processing device determines the LWP is sufficiently programmed and forgoes the dummy write operation (operation 430).

If the number of zeros does not satisfy the threshold constraint (e.g., if the number of zeros is less than the threshold constraint), the processing device performs a dummy write operation on the LWP, at operation 425. The dummy write operation includes writing dummy data to the LWP.

As shown in FIG. 5, the method 400 can, in some embodiments, include operations 505 and 510. As shown, operations 505 and 510 can be performed as part of (e.g., sub-operations or a sub-routine) operation 410, where the processing device determines a count of zeroes programmed in the LWP.

As noted above, the memory device can include multiple page types and each page type has one or more associated default read levels. At operation 505, the processing device modifies a read level associated with the LWP. For example, the processing device can increasing a read level associated with the LWP relative to the default read level. By increasing the read level, the processing device increases the threshold for determining whether a memory cell threshold voltage represents a zero. The processing device increases the read level to provide additional margin to the system for detecting the number of programmed bits.

At operation 510, the processing device determines the number of zeros programmed in the LWP based on the modified read level. More specifically, the processing device determines a zero is programmed into a particular cell based on a comparison of the threshold voltage of the cell to the modified read level. In particular, if threshold voltage of the cell is higher than the modified read level, the cell is recognized as zero.

EXAMPLES

Example 1 is a memory sub-system comprising: a memory device comprising at least one memory block comprising multiple pages; and a processing device, operatively coupled with the memory device, to perform operations comprising: detecting an asynchronous power loss event at the memory device; in response to detecting the asynchronous power loss event, identifying a last written page from among the multiple pages; determining a count of zeroes programmed in the last written page; and determining whether to perform a dummy write operation at the last written page based on the count of zeroes programmed in the last written page.

Example 2 includes the memory sub-system of example 1, wherein determining whether to perform the dummy write operation at the last written page comprises comparing the count of zeroes programmed in the last written page to a threshold constraint.

Example 3 includes the memory sub-system of any one of examples 1 and 2, wherein the operations comprise: performing a dummy write operation at the last written page in response to determining the zeroes programmed in the last written page does not satisfy the threshold constraint, the dummy write operation comprising writing dummy data to the last written page.

Example 4 includes the memory sub-system of any one of examples 1-3, wherein the operations comprise: foregoing the dummy write operation in response to determining the count of zeroes programmed in the last written page satisfy the threshold constraint.

Example 5 includes the memory sub-system of any one of examples 1-4, wherein the determining of the count of zeroes programmed in the last written page includes: comparing a threshold voltage of a cell in the last written page to a read level associated with the last written page to determine whether a zero is programmed in the cell.

Example 6 includes the memory sub-system of any one of examples 1-5, wherein the determining of the count of zeroes programmed in the last written page includes: modifying a read level associated with the last written page.

Example 7 includes the memory sub-system of any one of examples 1-6, wherein the determining of the count of zeroes programmed in the last written page comprises: determining a zero is programmed in a cell of the last written page based on a comparison of a threshold voltage of the cell with the modified read level.

Example 8 includes the memory sub-system of any one of examples 1-7, wherein in the modifying of the read level associated with the last written page includes decreasing the read level below a default read level.

Example 9 includes the memory sub-system of any one of examples 1-8, wherein the default read level associated with the last written page is based on a page type of the last written page.

Example 10 is a method comprising: detecting an asynchronous power loss event at a memory device comprising at least one memory block, the at least one block comprising multiple pages; in response to detecting the asynchronous power loss event, identifying a last written page from among the multiple pages; determining a count of zeroes programmed in the last written page; and determining whether to perform a dummy write operation at the last written page based on the count of zeroes programmed in the last written page Example 11 includes the method of example 10, wherein determining whether to perform the dummy write operation at the last written page comprises comparing the count of zeroes programmed in the last written page to a threshold constraint.

Example 12 includes the method of any one of examples 10-11, wherein the operations comprise: performing a dummy write operation at the last written page in response to determining the zeroes programmed in the last written page does not satisfy the threshold constraint, the dummy write operation comprising writing dummy data to the last written page.

Example 13 includes the method of any one of examples 10-12, wherein the operations comprise: foregoing the dummy write operation in response to determining the count of zeroes programmed in the last written page satisfy the threshold constraint.

Example 14 includes the method of any one of examples 10-13, wherein the determining of the count of zeroes programmed in the last written page includes: comparing a threshold voltage of a cell in the last written page to a read level associated with the last written page to determine whether a zero is programmed in the cell.

Example 15 includes the method of any one of examples 10-14, wherein the determining of the count of zeroes programmed in the last written page includes: modifying a read level associated with the last written page.

Example 16 includes the method of any one of examples 10-15, wherein the determining of the count of zeroes programmed in the last written page comprises: determining a zero is programmed in a cell of the last written page based on a comparison of a threshold voltage of the cell with the modified read level.

Example 17 includes the method of any one of examples 10-16, wherein in the modifying of the read level associated with the last written page includes decreasing the read level below a default read level. wherein in the modifying of the read level associated with the last written page includes decreasing the read level below a default read level.

Example 18 is a computer-readable storage medium comprising instructions that, when executed by a processing device, configure the processing device to perform operations comprising: detecting an asynchronous power loss event at a memory device comprising at least one memory block, the at least one block comprising multiple pages; in response to detecting the asynchronous power loss event, identifying a last written page from among the multiple pages; determining a count of zeroes programmed in the last written page; and comparing the count of zeroes programmed in the last written page to a threshold constraint to determine whether to perform a dummy write operation at the last written page based on the count of zeroes programmed in the last written page.

Example 19 includes the computer-readable storage medium of example 18, wherein the operations further comprise: performing a dummy write operation at the last written page in response to determining the zeroes programmed in the last written page does not satisfy the threshold constraint, the dummy write operation comprising writing dummy data to the last written page.

Example 20 includes the computer-readable storage medium of any one of examples 18 and 19, wherein the operations further comprise: foregoing the dummy write operation in response to determining the count of zeroes programmed in the last written page satisfy the threshold constraint.

Figure 6:
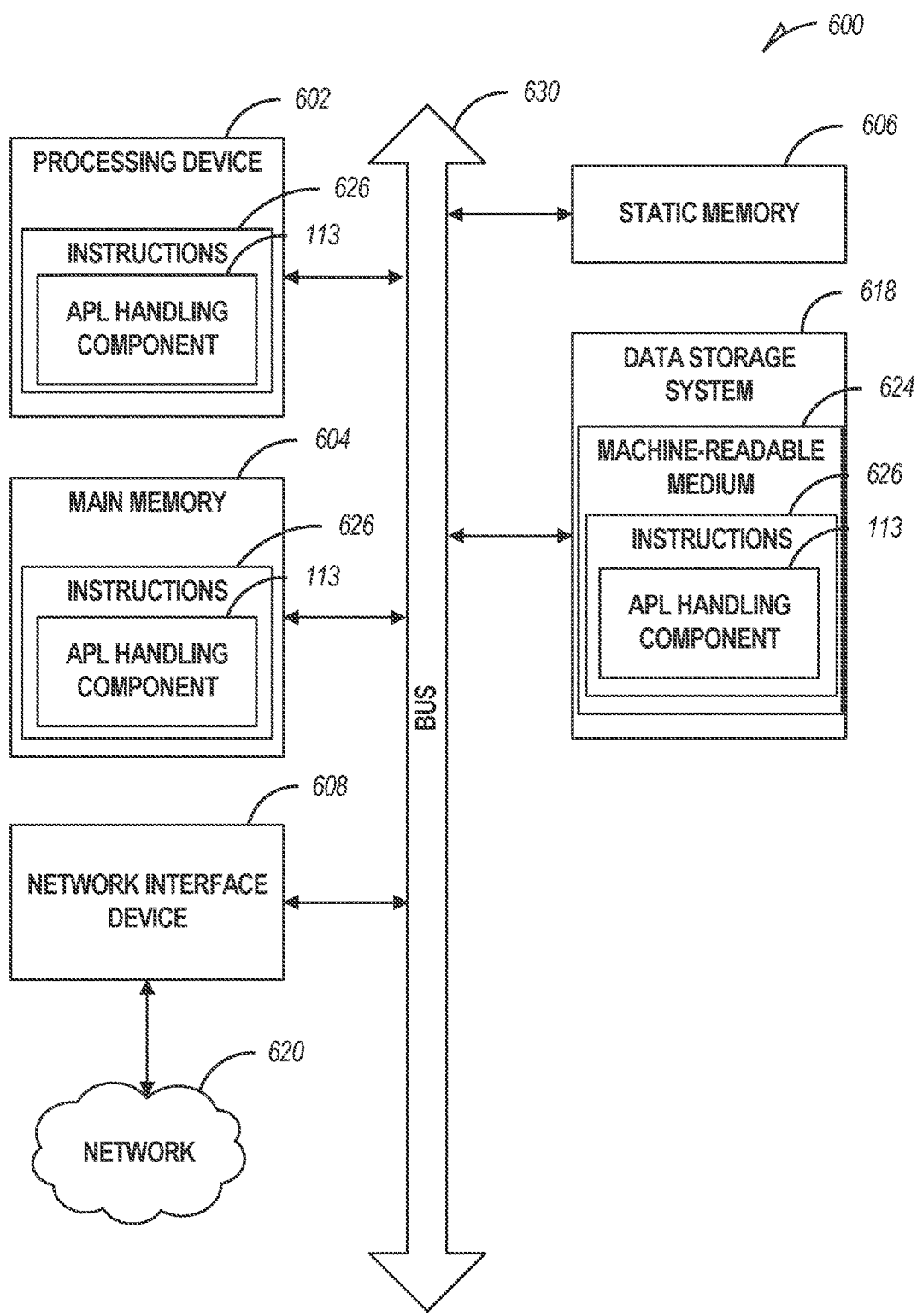
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the APL handling component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data destruction component (e.g., the APL handling component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, configured to perform operations comprising:
   detecting an asynchronous power loss event at the memory device; and
   in response to detecting the asynchronous power loss event, performing an asynchronous power loss recovery process, the performing of the asynchronous power loss recovery process comprising determining whether to write dummy data to a last written page based on a number of zeroes programmed in the last written page.

2. The system of claim 1, wherein the performing asynchronous power loss recovery process further comprises performing a dummy write operation at the last written page in response to determining the number of zeroes programmed in the last written page does not satisfy a threshold constraint, the dummy write operation comprising writing the dummy data to the last written page.

3. The system of claim 1, wherein the performing asynchronous power loss recovery process further comprises foregoing a dummy write operation to write the dummy data to the last written page in response to determining the number of zeroes programmed in the last written page satisfy a threshold constraint.

4. The system of claim 1, wherein the performing asynchronous power loss recovery process further comprises determining the number of zeroes programmed in the last written page.

5. The system of claim 4, wherein the determining of the number of zeroes programmed in the last written page includes:
   comparing a threshold voltage of a cell in the last written page to a read level associated with the last written page to determine whether a zero is programmed in the cell.

6. The system of claim 4, wherein the determining of the number of zeroes programmed in the last written page includes:
   modifying a read level associated with the last written page.

7. The system of claim 6, wherein the determining of the number of zeroes programmed in the last written page comprises:
   determining a zero is programmed in a cell of the last written page based on a comparison of a threshold voltage of the cell with the modified read level.

8. The system of claim 6, wherein in the modifying of the read level associated with the last written page includes decreasing the read level below a default read level.

9. The system of claim 8, wherein the default read level associated with the last written page is based on a page type of the last written page.

10. A method comprising:
    detecting, by a processing device, an asynchronous power loss event at a memory device; and
    in response to detecting the asynchronous power loss event, performing, by the processing device, an asynchronous power loss recovery process, the performing of the asynchronous power loss recovery process comprising determining whether to write dummy data to a last written page based on a number of zeroes programmed in the last written page.

11. The method of claim 10, wherein the performing asynchronous power loss recovery process further comprises performing a dummy write operation at the last written page in response to determining the number of zeroes programmed in the last written page does not satisfy a threshold constraint, the dummy write operation comprising writing the dummy data to the last written page.

12. The method of claim 10, wherein the performing asynchronous power loss recovery process further comprises foregoing a dummy write operation to write the dummy data to the last written page in response to determining the number of zeroes programmed in the last written page satisfy a threshold constraint.

13. The method of claim 10, wherein the performing asynchronous power loss recovery process further comprises determining the number of zeroes programmed in the last written page.

14. The method of claim 13, wherein the determining of the number of zeroes programmed in the last written page includes:
   comparing a threshold voltage of a cell in the last written page to a read level associated with the last written page to determine whether a zero is programmed in the cell.

15. The method of claim 13, wherein the determining of the number of zeroes programmed in the last written page includes:
   modifying a read level associated with the last written page.

16. The method of claim 15, wherein the determining of the number of zeroes programmed in the last written page comprises:
   determining a zero is programmed in a cell of the last written page based on a comparison of a threshold voltage of the cell with the modified read level.

17. The method of claim 15, wherein in the modifying of the read level associated with the last written page includes decreasing the read level below a default read level.

18. The method of claim 17, wherein the default read level associated with the last written page is based on a page type of the last written page.

19. A non-transitory computer-readable storage medium comprising instructions that, when executed by a processing device, configure the processing device to perform operations comprising:
   detecting an asynchronous power loss event at a memory device; and
   in response to detecting the asynchronous power loss event, performing an asynchronous power loss recovery process, the performing of the asynchronous power loss recovery process comprising determining whether to write dummy data to a last written page based on a number of zeroes programmed in the last written page.

20. The non-transitory computer-readable storage medium of claim 19, wherein the performing asynchronous power loss recovery process further comprises:
   foregoing a dummy write operation to write the dummy data to the last written page in response to determining the number of zeroes programmed in the last written page satisfy a threshold constraint.

* * * * *